(12) United States Patent
Lim et al.

(10) Patent No.: US 10,854,362 B2
(45) Date of Patent: Dec. 1, 2020

(54) GUIDE-CONNECTED CONTACTOR AND PORTABLE ELECTRONIC DEVICE COMPRISING SAME

(71) Applicant: AMOTECH CO., LTD., Incheon (KR)

(72) Inventors: Byung Guk Lim, Incheon (KR); Dong Hun Kong, Incheon (KR); Jae Woo Choi, Gyeonggi-do (KR); Jae Su Ryu, Seoul (KR)

(73) Assignee: AMOTECH CO., LTD., Incheon (KR)

( * ) Notice: Subject to any disclaimer, the term of this patent is extended or adjusted under 35 U.S.C. 154(b) by 0 days.

(21) Appl. No.: 16/079,902

(22) PCT Filed: Feb. 21, 2017

(86) PCT No.: PCT/KR2017/001873
§ 371 (c)(1),
(2) Date: Aug. 24, 2018

(87) PCT Pub. No.: WO2017/146435
PCT Pub. Date: Aug. 31, 2017

(65) Prior Publication Data
US 2019/0074113 A1    Mar. 7, 2019

(30) Foreign Application Priority Data

Feb. 24, 2016  (KR) .......................... 10-2016-0022149
Apr. 22, 2016  (KR) .......................... 10-2016-0049365
(Continued)

(51) Int. Cl.
*H01R 13/24*     (2006.01)
*H01R 13/703*    (2006.01)
*H01C 7/10*      (2006.01)
*H05K 9/00*      (2006.01)
(Continued)

(52) U.S. Cl.
CPC ................. *H01C 7/10* (2013.01); *H01G 4/40* (2013.01); *H01R 13/24* (2013.01);
(Continued)

(58) Field of Classification Search
CPC ....... H01R 13/24; H01R 13/703; H04M 1/02; H05K 9/0079; H01G 4/40; H01C 7/10
See application file for complete search history.

(56) References Cited

U.S. PATENT DOCUMENTS 6,293,806 B1 * 9/2001 Yu ...................... H01R 13/2435
                                                       439/66
6,555,764 B1 * 4/2003 Maruyama ............... G01R 3/00
                                                       174/267
(Continued)

FOREIGN PATENT DOCUMENTS

JP     05-090978        12/1993
KR     10-0753187        8/2007
(Continued)

OTHER PUBLICATIONS

International Search Report Issued in Corresponding PCT Application No. PCT/KR2017/002051, dated Jun. 9, 2017.
(Continued)

*Primary Examiner* — Edwin A. Leon
*Assistant Examiner* — Milagros Jeancharles
(74) *Attorney, Agent, or Firm* — Norton Rose Fulbright US LLP

(57) ABSTRACT

Provided are a guide-connected contactor and a portable electronic device comprising same. A guide-connected contactor, according to an embodiment of the present invention, comprises: an elastic conductor which comes in contact with a circuit board of an electronic device or a bracket connected to the circuit board; a functional element which is connected to the elastic conductor and has a first electrode and a second (Continued)

electrode on the upper surface and the lower surface, respectively; and a guide which is plate-shaped, has the functional element connected thereto, and is connected to a groove portion provided on a conductive case of the electronic device.

18 Claims, 10 Drawing Sheets

(30) Foreign Application Priority Data

| | | |
|---|---|---|
| Apr. 22, 2016 | (KR) | ........................ 10-2016-0049377 |
| Dec. 22, 2016 | (KR) | ........................ 10-2016-0176414 |
| Jan. 3, 2017 | (KR) | ........................ 10-2017-0000587 |

(51) Int. Cl.
*H01R 13/6584* (2011.01)
*H04M 1/02* (2006.01)
*H01G 4/40* (2006.01)

(52) U.S. Cl.
CPC ..... *H01R 13/2414* (2013.01); *H01R 13/6584* (2013.01); *H01R 13/703* (2013.01); *H04M 1/02* (2013.01); *H04M 1/0202* (2013.01); *H05K 9/0067* (2013.01); *H05K 9/0079* (2013.01); *H04M 1/0277* (2013.01)

(56) References Cited

U.S. PATENT DOCUMENTS

| | | | | |
|---|---|---|---|---|
| 8,964,380 | B2* | 2/2015 | Lee | .................... H01R 13/2442 |
| | | | | 361/679.56 |
| 8,988,095 | B2* | 3/2015 | Nakamura | ........... G01R 1/0483 |
| | | | | 324/756.02 |
| 9,240,645 | B1 | 1/2016 | Ma | |
| 10,640,945 | B1* | 5/2020 | Niroumand | ............... E02D 5/44 |
| 2010/0003870 | A1* | 1/2010 | Okuda | ................. H01R 12/714 |
| | | | | 439/884 |
| 2014/0146992 | A1* | 5/2014 | Jun | ...................... H01R 12/721 |
| | | | | 381/388 |
| 2017/0005464 | A1* | 1/2017 | Hwang | ............... H01R 13/2442 |
| 2017/0194739 | A1* | 7/2017 | Park | .................... H01R 13/6205 |
| 2019/0190167 | A1* | 6/2019 | Choi | .................... H05K 1/0259 |
| 2019/0281689 | A1* | 9/2019 | Lim | ...................... H01R 13/24 |
| 2020/0212614 | A1* | 7/2020 | Lim | ...................... H05K 1/0268 |

FOREIGN PATENT DOCUMENTS

| | | |
|---|---|---|
| KR | 10-2007-0109332 | 2/2008 |
| KR | 10-1033990 | 5/2011 |
| KR | 10-2013-0026735 | 3/2013 |
| KR | 10-1339166 | 12/2013 |
| KR | 10-2011-0133502 | 12/2014 |
| KR | 10-1556936 | 10/2015 |
| KR | 101585604 | 1/2016 |
| KR | 1638053 | 7/2016 |
| WO | WO 2017/146517 | 8/2017 |

OTHER PUBLICATIONS

International Search Report Issued in Corresponding PCT Application No. PCT/KR2017/001873, dated May 31, 2017.

\* cited by examiner

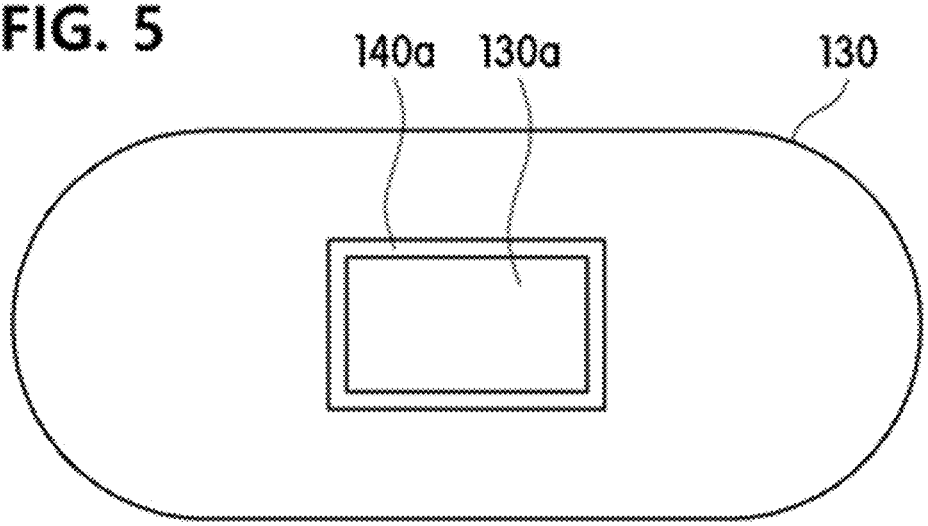
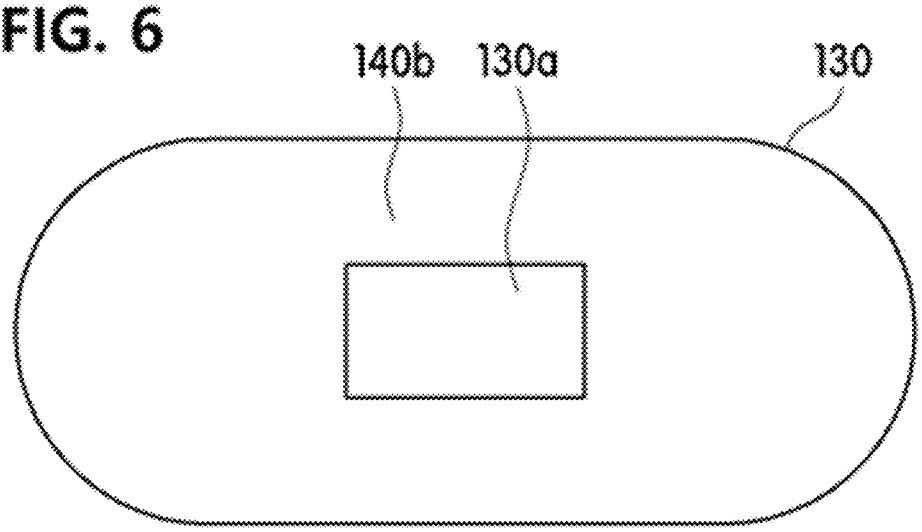

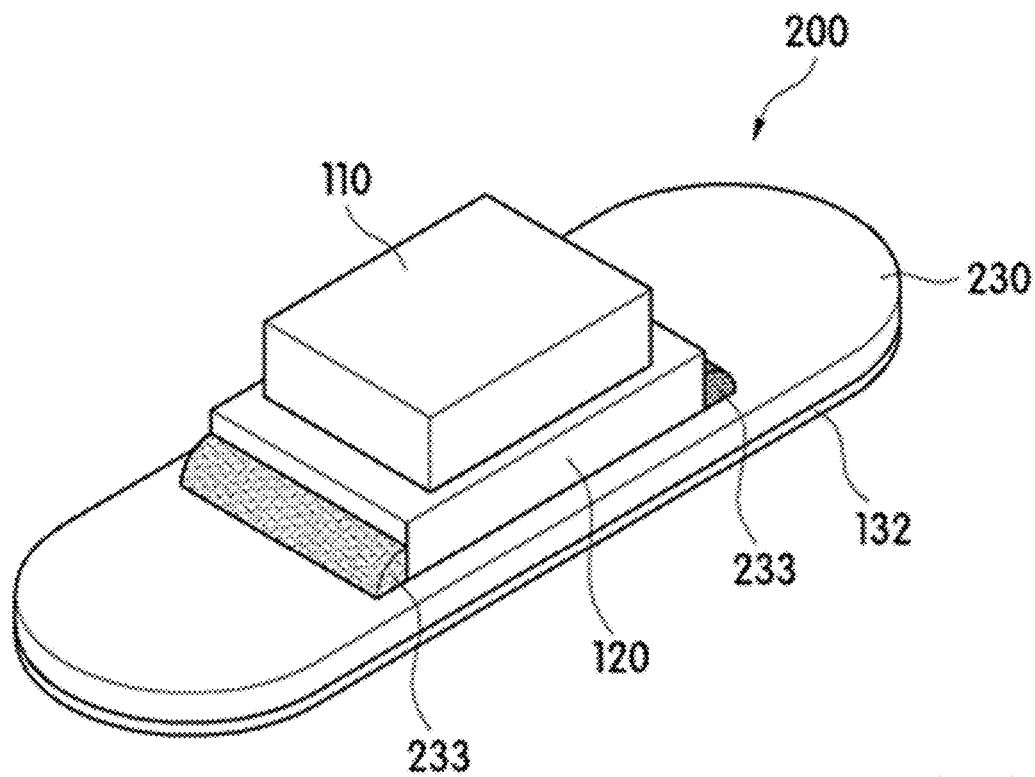
FIG. 12
FIG. 13
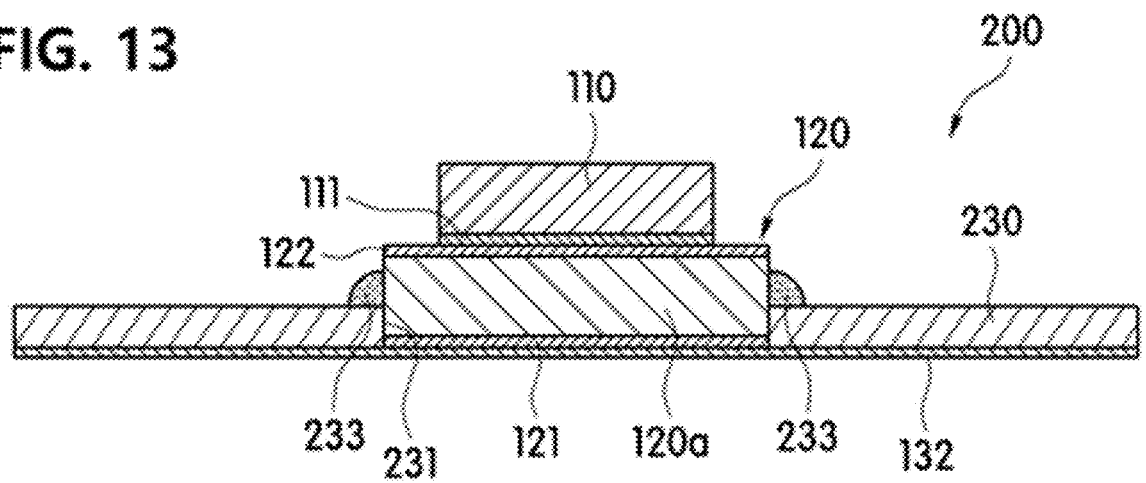

FIG. 14
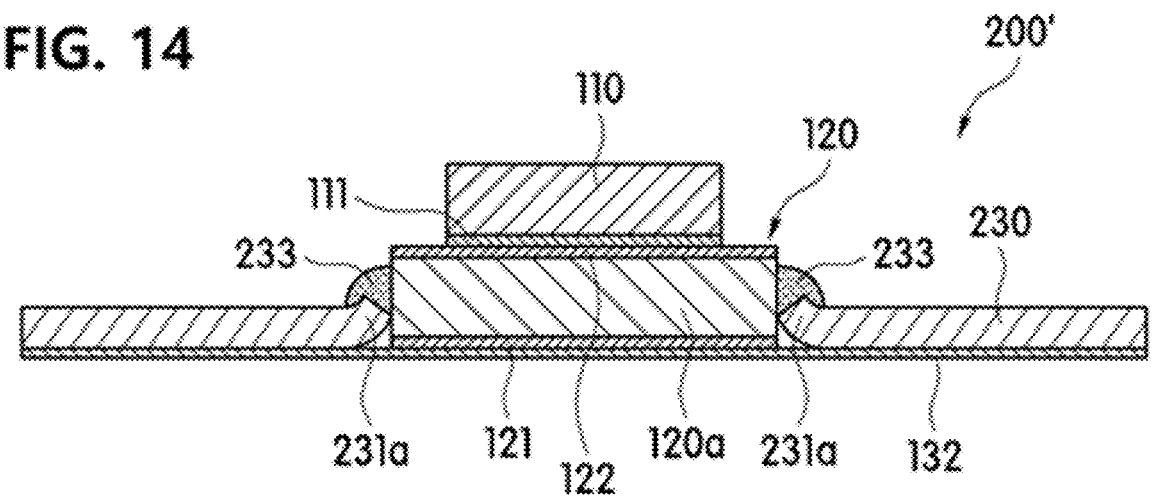
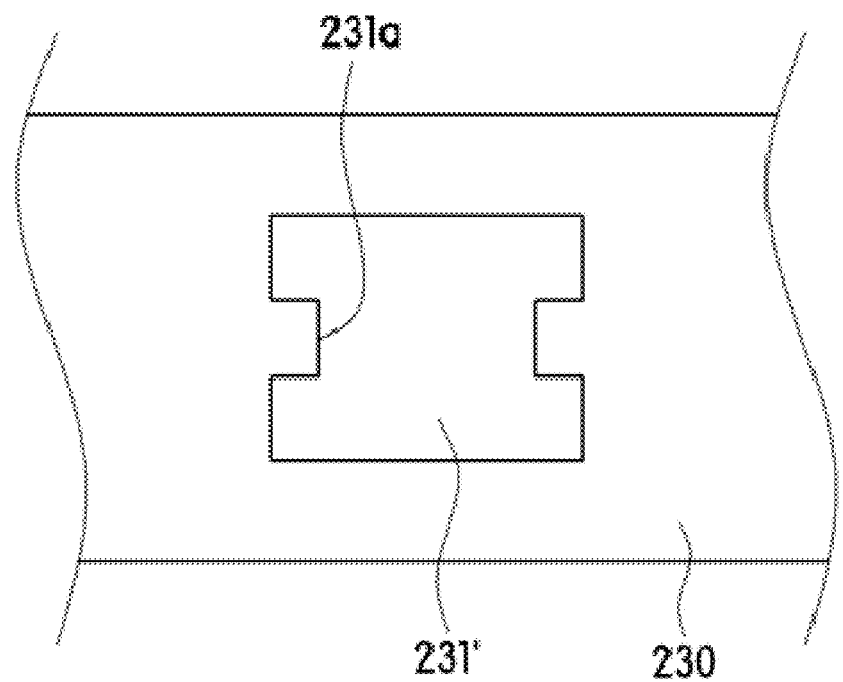
FIG. 15

GUIDE-CONNECTED CONTACTOR AND PORTABLE ELECTRONIC DEVICE COMPRISING SAME

CROSS-REFERENCE TO RELATED APPLICATIONS

This application is a national phase application under 35 U.S.C. § 371 of International Application No. PCT/KR2017/001873, filed Feb. 21, 2017, which claims priority to and the benefit of Korean Patent Applications No. 10-2016-0022149, filed Feb. 24, 2016, No. 10-2016-0049365, filed Apr. 22, 2016, No. 10-2016-0049377, filed Apr. 22, 2016, No. 10-2016-0176414, filed Dec. 22, 2016, and No. 10-2017-0000587, filed Jan. 3, 2017. The contents of each of the referenced patent applications are incorporated into the present application by reference.

FIELD OF THE DISCLOSURE

The present invention relates to a contactor for an electronic device such as a smart phone, and more specifically, to a guide-connected contactor capable of improving stability of connection, a degree of freedom in design, and processability of a contactor, and a portable electronic device including the same.

DESCRIPTION OF RELATED ART

Recently, housings formed of metals are increasingly used for portable electronic devices to improve aesthetics and robustness of the portable electronic devices. Such a portable electronic device includes a conductive gasket or a conductive contactor provided between an external housing and an internal circuit board of the portable electronic device to attenuate an impact from the outside, to reduce electromagnetic waves introduced into or propagated from the portable electronic device, and to electrically connect an antenna disposed in the external housing to the internal circuit board.

However, since an electrical path may be formed between the external housing and the internal circuit board due to the conductive gasket or the conductive contactor, when static electricity having a high voltage is suddenly introduced through a conductor such as an external metal housing, the static electricity may be introduced into the internal circuit board through the conductive gasket or the conductive contactor, thereby causing damage to a circuit such as an integrated circuit (IC). In addition, a leakage current generated by alternating current (AC) power may propagate to the external housing along a ground portion of the circuit so that a user may feel discomfort or, in a severe case, an electric shock accident causing injury to the user may occur.

Further, when the metal housing is used as an antenna, the conductive gasket or the conductive contactor is required to have a high capacitance because a signal attenuation that interrupts an RF signal transmission may occur when the capacitance is low.

In this regard, a protective element for protecting the user from the static electricity or leakage current is provided together with a conductive gasket or a conductive contactor for connecting the metal housing and the circuit board. When a conductor such as a metal case is used, there is a need to provide a functional contactor having various functions of protecting the user or circuits in a portable electronic device or facilitating the transmission of communication signals in addition to a function of a simple electrical contact.

Further, when a component provided in the form of a single module is installed in a portable electronic device, the electrical connection failure may occur more frequently at a connection portion between the single module and the portable electronic device than a connection portion between functional units constituting the single module. Thus, there is a need to check the electrical connection between the contactor and the portable electronic device.

In addition, when the functional contactor is coupled to a conductive case, a stable connection is required because soldering work is difficult, so the design change according to a shape of a groove of the conductive case may not be easily achieved depending on a coupling position, and the position selection is required with careful attention when performing coupling work, thereby frequently causing defects.

SUMMARY OF THE INVENTION

The present invention has been made in view of the above-mentioned problems, and it is an object of the present invention to provide a guide-connected contactor having various functions in addition to an inherent function thereof to realize various functions as described above and to easily check the electrical connection of a contactor without increasing the number of components or increasing the size of an electronic device, and a portable electronic device including the guide-connected contactor.

It is another object of the present invention to provide a guide-connected contactor, which can improve workability in a manufacturing process by using a guide that is easier to handle than a functional element or a contactor and a portable electronic device including the guide-connected contactor.

Still another object of the present invention is to provide a guide-connected contactor, in which a guide is separately manufactured so that the guide-connected contactor can be easily applied to various types of conductive cases by changing the guide only and can be stably coupled to a conductive case of an electronic device and a portable electronic device including the guide-connected contactor.

Still another object of the present invention is to provide a guide-connected contactor, in which a guide has a position alignment function for a functional element so that the functional element can be aligned on an accurate position of the guide even when soldering work is performed to combine the guide and the functional element and a portable electronic device including the guide-connected contactor.

In order to achieve the above-mentioned objects, the present invention provides a guide-connected contactor including: an elastic conductor configured to come into contact with a circuit board of an electronic device or a bracket coupled to the circuit board; a functional element connected to the elastic conductor and having a first electrode and a second electrode on upper and lower surfaces thereof, respectively; and a guide having a plate shape, coupled with the functional element, and connected to a groove portion formed on a conductive case of the electronic device.

According to an exemplary embodiment of the present invention, the guide-connected contactor may further include an alignment member formed on an upper surface of the guide to surround at least a portion of the functional element so as to align a position of the functional element, wherein the functional element may be coupled to the guide through a solder.

The alignment member may include one of a photo imagable solder resist (PSR) ink, a heat resistant film, an overglass, and a nonconductive resin.

In this case, the alignment member may be provided on the upper surface of the guide except for a region on which the elastic conductor is laminated.

As an example, the alignment member may be integrally formed.

As another example, the alignment member may include at least two alignment members disposed symmetrically.

In addition, the alignment member may be configured as a groove formed in the upper surface of the guide.

The guide may further include a wing portion protruding from only a part of a side surface of the guide. The wing portion may have a shape corresponding to a shape of an opening portion extending outward from one side of an outer periphery of the groove portion.

The guide may have a through hole at a center thereof, the functional element may be inserted into the through hole, a bonding member may be fixedly provided between the functional element and at least a part of the through hole, and the guide may include a barrier portion provided on at least a portion around the through hole to prevent the bonding member from flowing downward.

As an example, when the functional element is inserted, the barrier portion may be bent in an insertion direction of the functional element through the through hole.

As another example, the barrier portion may protrude inward into the through hole, and a recess portion may be formed in a lower surface of the functional element so that the functional element may be mounted on the protruded barrier portion.

As another example, the barrier portion may include a groove or a stepped portion provided on the upper surface of the guide.

In this case, the functional element may be fixed to at least a part of the through hole temporarily or permanently by the bonding member provided therebetween.

In addition, the guide may include a conductor or a nonconductor. The conductor may include one of stainless steel (SUS), phosphor bronze, aluminum, and nickel silver, and the nonconductor may include one of a printed circuit board (PCB) material including FR4, a polyethylene terephthalate (PET) film, and a plastic.

The guide may be coupled to the groove portion by a conductive adhesive layer.

The guide may have a shape corresponding to a shape of the groove.

In addition, the functional element may include: a first test electrode provided on an upper surface of the functional element and electrically connected to the conductive case; and a second test electrode spaced apart from the first test electrode by a predetermined distance.

The functional element may have at least one of an electric shock prevention function for blocking a leakage current of an external power source introduced from a ground of the circuit board of the electronic device, a communication signal transmission function for transmitting a communication signal introduced from the conductive case or the circuit board, and an electrostatic discharge (ESD) protection function for discharging static electricity introduced from the conductive case.

Meanwhile, the present invention provides a portable electronic device including: the guide-connected contactor as described above; and a conductive case having a groove portion to which the guide-connected contactor is coupled, wherein the groove portion has a shape corresponding to a shape of the guide, and the elastic conductor of the guide-connected contactor comes into contact with the circuit board or the conductive bracket provided at one side thereof with the circuit board.

According to the present invention, since a guide corresponding to a groove portion of a conductive case is provided integrally with a contactor, even when the conductive case is roughly processed using a drill having a relatively large diameter to form the groove portion on the conductive case, a residual space of the groove portion can be filled by the guide, so that a manufacturing time can be reduced and a manufacturing efficiency can be improved while providing the stable coupling. In addition, a customized device can be provided according to specifications required by a customer, so that it is possible to quickly respond to a request of the customer.

In addition, according to the present invention, the contactor is disposed in the conductive case, and the guide corresponding to the groove portion of the conductive case is provided, so an electrical connection state can be easily confirmed. Thus, the possibility of failures occurring in a manufacturing process can be easily checked, so that a failure rate of the products can be reduced.

Further, according to the present invention, an alignment member is provided around a laminated region of a functional element on the guide. Thus, when the functional element is laminated on the guide by soldering, the functional element can be aligned at a correct position, so that the functional element can be prevented from being tilted, thereby preventing electrical or mechanical failures. Therefore, the functional element can be stably coupled so that the precision and reliability of the product can be improved.

In addition, according to the present invention, since a wing portion is provided on the guide of the contactor, the contactor can be easily positioned in the groove portion of the conductive case or can be easily removed from the groove portion, so that the workability in the process can be improved and it is easy to handle the contactor, thereby reducing a failure rate.

According to the present invention, the functional element is inserted into a through hole of the guide such that the functional element can be directly coupled to the conductive case without passing through the guide, so that a current path through the functional element can be shortened and the resistance can be lowered, thereby reducing an RF loss.

Further, according to the present invention, since an outer periphery of the functional element inserted into the through hole of the guide is fixed by a bonding member, the guide and the functional element can be stably coupled to each other, so that the workability in the process of coupling the contactor to the conductive case can be improved and the electrical conductivity can be enhanced, thereby reducing a failure rate of the products.

BRIEF DESCRIPTION OF THE DRAWINGS

FIG. 5 is a plan view illustrating an example of an alignment member which is integrally formed in the guide-connected contactor according to the embodiment of the present invention.

FIG. 6 is a plan view illustrating an example of an alignment member provided as a heat resistant film in the guide-connected contactor according to the embodiment of the present invention.

FIG. 12 is a perspective view illustrating still another example of the guide-connected contactor according to the embodiment of the present invention.

FIG. 13 is a sectional view of FIG. 12.

FIG. 14 is a sectional view illustrating still another example of the guide-connected contactor according to the embodiment of the present invention.

FIG. 15 is a plan view illustrating another example of a barrier portion in the guide-connected contactor according to the embodiment of the present invention.

DETAILED DESCRIPTION OF THE INVENTION

Figure 1:
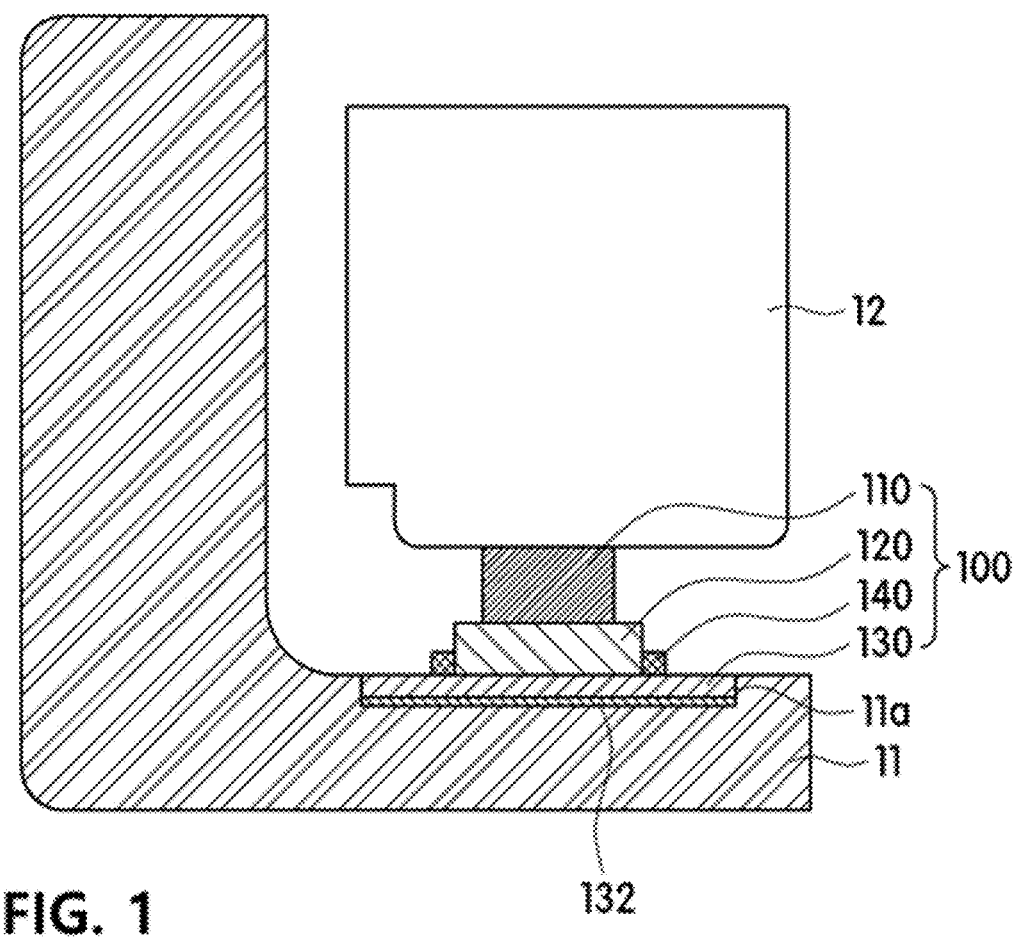
FIG. 1 is a sectional view illustrating an example of a guide-connected contactor according to an embodiment of the present invention applied to a portable electronic device.

Hereinafter, exemplary embodiments of the present invention will be described in detail with reference to the accompanying drawings such that those skilled in the art may easily implement the present invention. The present invention may be implemented in various forms and is not limited to the embodiments described herein. In the drawings, elements that do not relate to the present invention are omitted for clarifying the present invention, and the same reference numerals are assigned to the same or similar components throughout the specification.

Figure 3:
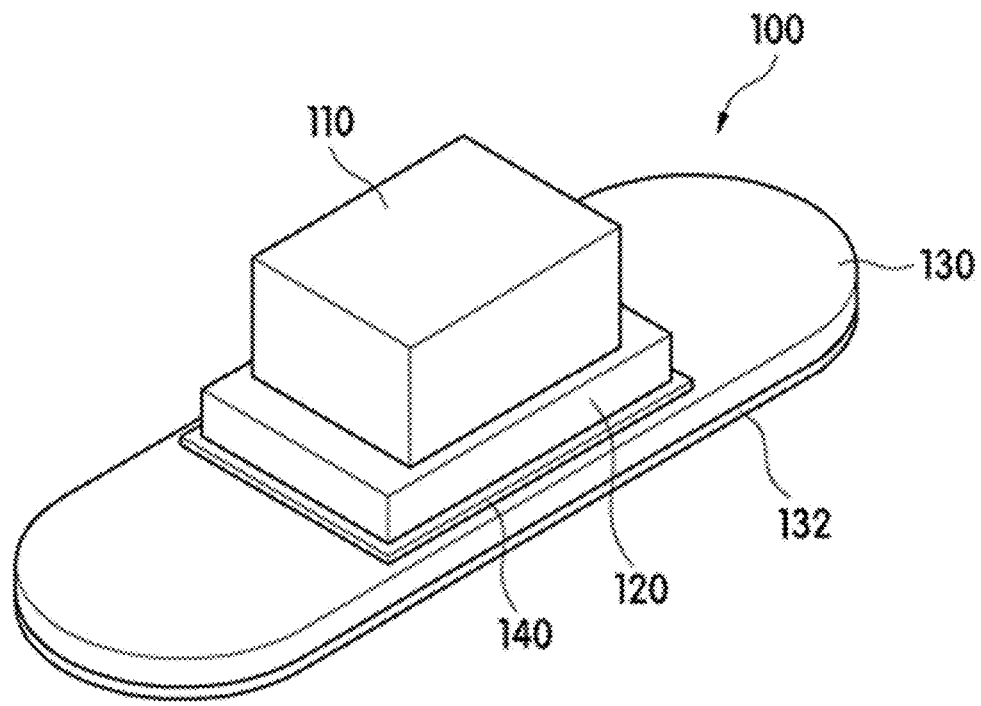
FIG. 3 is a perspective view illustrating an example of a guide-connected contactor according to an embodiment of the present invention.

As shown in FIGS. 1 and 3, a guide-connected contactor 100 according to an embodiment of the present invention includes an elastic conductor 110, a functional element 120, and a guide 130.

The guide-contact type contactor 100 is used to electrically connect a conductive case 11 such as an external metal case to a circuit board or a conductive bracket 12 in a portable electronic device.

The conductive bracket 12 may have a circuit board coupled to one side thereof and a display module coupled to the other side thereof. In this case, the conductive bracket 12 may be formed of a conductive material, for example, magnesium (Mg). Accordingly, the circuit board may be electrically connected to the conductive bracket 12.

Meanwhile, the portable electronic device may be in the form of a portable electronic appliance which is portable and easily carried. For example, the portable electronic device may be a portable terminal such as a smart phone, a cellular phone, or the like, and may be a smart watch, a digital camera, a digital multimedia broadcasting (DMB), an electronic book, a netbook, a tablet personal computer (PC), a portable computer, or the like. Such electronic devices may include any suitable electronic components including antenna structures for making communication with external devices. In addition, the portable electronic device may be an appliance using short-range network communication such as Wi-Fi or Bluetooth.

Figure 2:
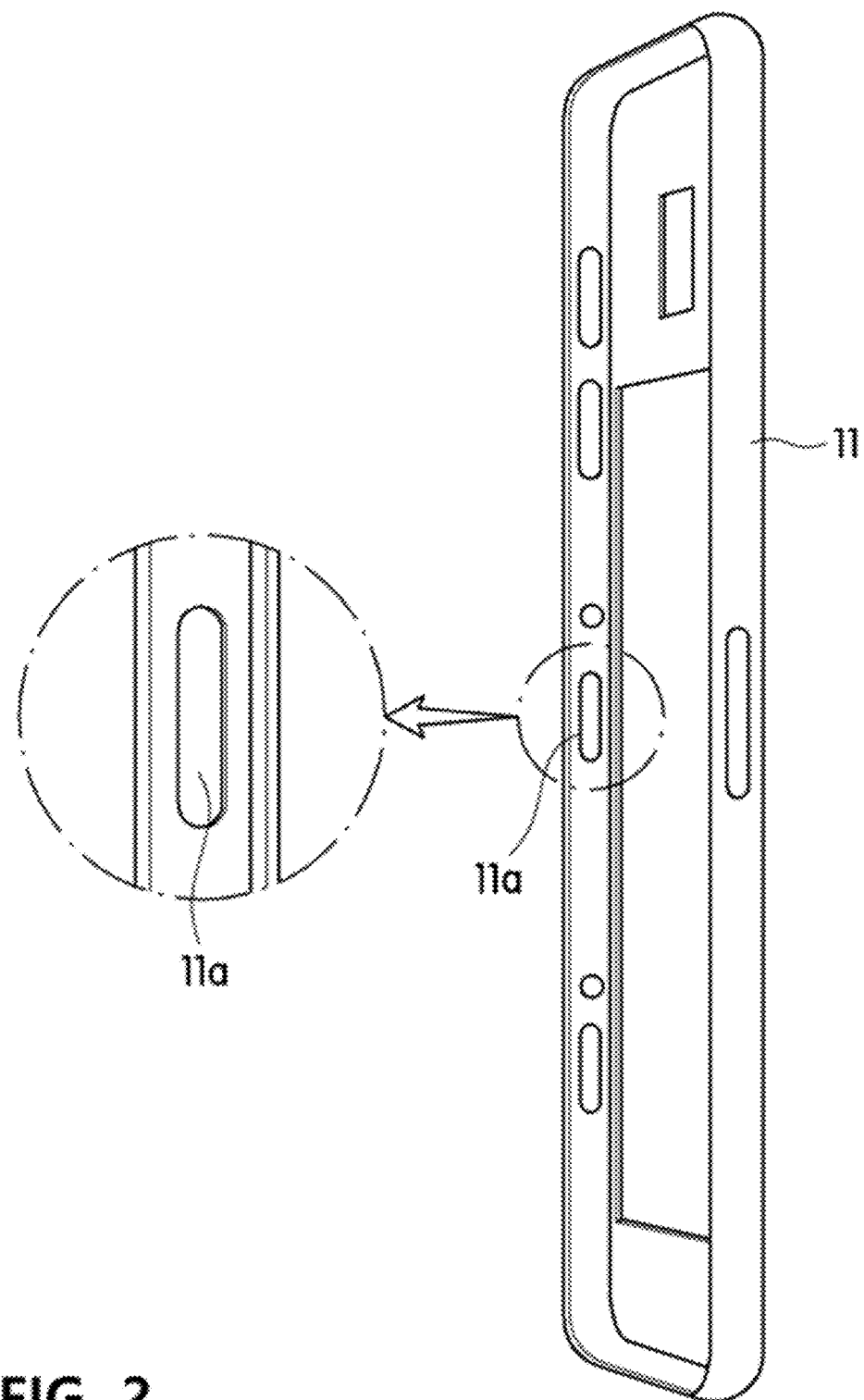
FIG. 2 is a perspective view illustrating an example of a conductive case of the portable electronic device shown in FIG. 1.

As shown in FIGS. 1 and 2, the conductive case 11 may be provided, for example, to partially or entirely surround a side portion of the portable electronic device, and may be an antenna for making communication with external devices.

A groove portion 11a for coupling the guide-connected contactor 100 is formed in an inner surface the conductive case 11, that is, the groove portion 11a may be formed in a surface of the conductive case 11 facing the circuit board or the bracket 12. The guide-connected contactor 100 may be electrically coupled to the groove portion 11a through the conductive adhesive layer 132.

As described above, since the groove portion 11a is provided in the conductive case 11 and the guide-connected contactor 100 is coupled to the conductive case 11 through a conductive adhesive layer 132, the guide-connected contactor 100 may be applied to a position where connection by soldering is not easy, that is, a position where connection to the circuit board is difficult, so that the degree of freedom in design can be improved.

Thus, a manufacturing cost can be reduced by omitting a separate medium such as a flexible printed circuit board (FPCB) that can be mounted by soldering, and the electrical characteristics can be improved by eliminating performance degradation factors caused by degradation of the medium.

The groove portion 11a may be formed using a metal mold in a process of manufacturing the conductive case 11, or may be formed on the manufactured conductive case 11 by a milling process or the like. In this case, since the guide-connected contactor 100 integrally includes the elastic conductor 110 and the functional element 120, the size of the groove portion 11a can be reduced, so that a mounting space can be reduced, thereby saving the manufacturing cost and time.

The elastic conductor 110 may have elasticity while making electrical contact with the circuit board or conductive bracket 12. The elastic conductor 110 may be a conductive gasket, a silicone rubber pad, or a clip-shaped conductor formed of a metal material having elasticity.

When the elastic conductor 110 comes into contact with the circuit board or the conductive bracket 12, the elastic conductor 110 may be compressed or deformed against the circuit board or the conductive bracket 12 due to a pressing force of the circuit board or the conductive bracket 12. When the conductive case 11 is separated from the circuit board or the conductive bracket 12, the elastic conductor 110 can be restored to its original state and position due to the elasticity.

Meanwhile, the elastic conductor 110 may be formed of a metal material as described above. However, when the elastic conductor 110 formed of the metal material is exposed to a corrosive environment in a state in which the elastic conductor 110 comes into contact with the circuit board or the conductive bracket 12, a galvanic corrosion may occur due to a potential difference between heterogeneous metals. In this case, in order to minimize the galvanic corrosion, a contact area of the elastic conductor 110 with respect to the circuit board or the conductive bracket 12 may be minimized as much as possible.

That is, the elastic conductor 110 may be configured to make a line-contact and/or a point-contact, rather than a surface-contact, with the circuit board or conductive bracket 12. For example, when the elastic conductor 110 is a conductive gasket or a silicone rubber pad, the elastic conductor 110 may come into surface-contact with the circuit board or the conductive bracket 12. For this reason, the elastic conductor 110 is configured as a clip formed of a metal material to make the line-contact and/or the point-contact with the circuit board or conductive bracket 12.

As described above, when the elastic conductor 110 is the conductive gasket, one side of the elastic conductor may come into surface-contact with the conductive case 11, and the other side of the elastic conductor may be electrically connected to the functional element 120 as shown in FIG. 1.

Figure 4:
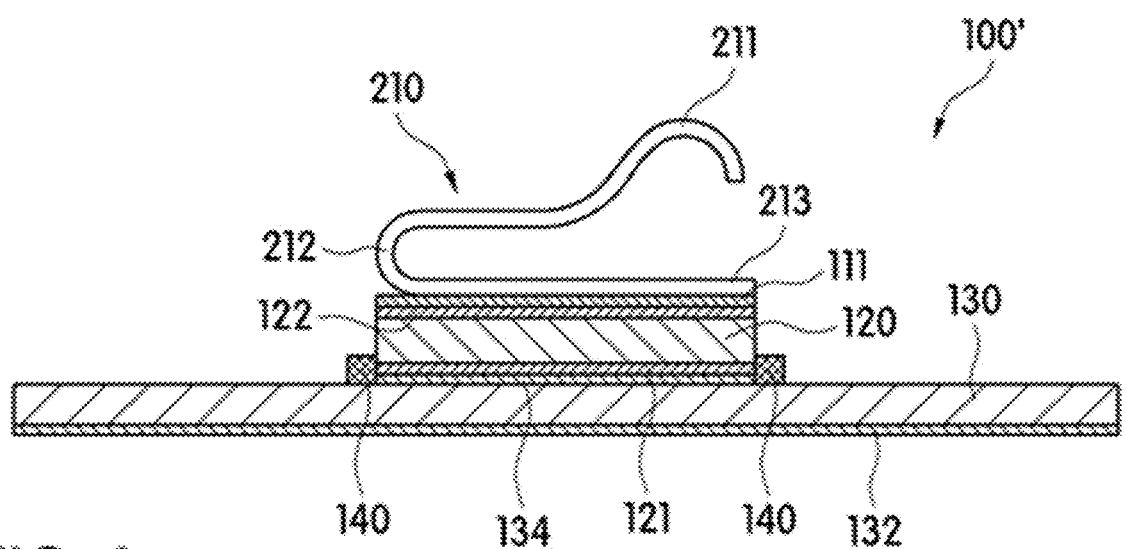
FIG. 4 is a sectional view illustrating an example of an elastic conductor in the guide-connected contactor according to the embodiment of the present invention.

As another example, in a case where the elastic conductor 110 is a C-shaped clip having a substantially "C" shape as shown in FIG. 4, the guide-connected contactor 100' may include a clip-shaped conductor 210 which comes into line-contact or point-contact with the circuit board or the bracket 12, so that the galvanic corrosion may not occur. The clip-shaped conductor 210 may include a contact portion 211, a bent portion 212, and a terminal portion 213.

The contact portion 211 may have a curved shape and make electrical contact with the circuit board or the conductive bracket 12 as shown in FIG. 1. The bent portion 212 extends from the contact portion 211 and may have elasticity. The terminal portion 213 may include a terminal electrically connected to the functional element 120.

The contact portion 211, the bent portion 212, and the terminal portion 213 may be integrally formed using a conductive material having elasticity.

The functional element 120 may be electrically connected to the elastic conductor 110 in series. For example, the functional element 120 may be laminated with the elastic conductor 110 through a conductive adhesive layer or a solder 111 (see FIG. 4).

In this case, the functional element 120 may include a first electrode 121 and a second electrode 122 on a lower surface and an upper surface thereof, respectively. That is, the first electrode 121 may be connected to a guide 130 through a first solder 134 and the second electrode 122 may be connected to the elastic conductor 110 the conductive adhesive layer or a second solder 111. The melting points of the first solder 134 and the second solder 111 may be different from each other. The melting point of the second solder 111 may be higher than the melting point of the first solder 134 so that the second solder 111 is not melted during a reflow process in which the first solder 134 is soldered.

The functional element 120 may have at least one of an electric shock prevention function for blocking a leakage current of an external power source introduced from the ground of the circuit board of the electronic device, an electric signal transmission function for transmitting a communication signal introduced from the conductive case 11 or the circuit board, and an electrostatic discharge (ESD) protection function for discharging static electricity introduced from the conductive case 11.

A functional contactor, in which the elastic conductor 110 and the functional element 120 are integrally provided, may be provided as a composite element having at least two functions of the electric shock prevention function for blocking the leakage current of the external power source, the electrostatic discharge protection function, and the communication signal transmission function. An example of the structure of the functional contactor is disclosed in Korean Registered Patent Nos. 1638053 and 1585604, but the present invention is not limited thereto. The functional contactor may adopt various structures when the structures have at least two functions of the electric shock prevention function, electrostatic discharge protection function, and the communication signal transmission function.

As described above, since the elastic conductor 110 and the functional element 120 are provided integrally, an additional space, which is required when the elastic conductor 110 and the functional element 120 are separately arranged, is not required such that the portable electronic device can be minimized. Thus, a space for coupling the guide-connected contactor 100 to the conductive case 11 is also minimized. Accordingly, when the groove portion 11a is formed in the conductive case 11 through a milling process, the manufacturing cost and the manufacturing time can be saved.

The guide 130 is a medium for fixedly coupling the elastic conductor 110 and the functional element 120, which are integrally formed, to the conductive case 11 and is coupled to the groove portion 11a of the conductive case 11 of the portable electronic device. In this case, the guide 130 may be coupled to the groove portion 11a through the conductive adhesive layer 132 such as a conductive adhesive film.

The guide 130 may have a plate shape. As shown in FIG. 4, the functional element 120 may be laminated on the guide 130 through the first solder 134.

Since the functional element 120 is laminated on the guide 130, only the guide 130 having a larger area and a design, which is easier to change than the functional element 120, may face the groove portion 11a of the conductive case, so that the guide-connected contactor 100 can be easily coupled to the groove portion 11a of the conductive case, thereby improving workability in the manufacturing process.

In addition, the guide 130 may have a shape corresponding to a shape of the groove portion 11a of the conductive case 11. For example, both ends of the guide 130 may have a curved shape as shown in FIG. 3 or a rectangular shape (not shown). However, the shape of the guide 130 is not limited thereto and the guide 130 may have various shapes depending on the shape of the groove portion 11a formed in the conductive case.

The guide 130 may be formed of a conductive material. In this case, the guide 130 may be used as a test point (TP) for confirming the electrical connection of the elastic conductor 110 or between the functional element 120 and the conductive case 11. The conductive material may include stainless steel (SUS), phosphor bronze, aluminum, or nickel silver.

In this manner, since the guide 130 is formed of the conductive material, the electrical connection of the elastic conductor 110 or the electrical connection between the functional element 120 and the conductive case 11 can be easily confirmed throughout the entire region of the guide 130 without using a separate TP. Therefore, it is possible to easily check the possibility of defects that may occur in the manufacturing process due to degradation of characteristics or defective coupling of the conductive adhesive layer 132, the conductive adhesive layer, or the solder 111, thereby reducing a failure rate of products.

Alternatively, the guide 130 may be formed of a nonconductive material. The nonconductive material may include an epoxy or plastic, for example, polyester, polyethylene terephthalate (PET), printed circuit board (PCB) material including FR4 or the like.

Although not shown in the drawings, the guide 130 may include a wiring for electrically connecting a part of an upper surface of the guide 130 and the conductive adhesive layer 132 coupled to a lower surface of the guide 130. In this case, a part of the upper surface of the guide 130 may serve as a contact of the test point.

As described above, the guide-connected contactor 100 according to the embodiment of the present invention includes the guide 130 in addition to the integrated structure of the elastic conductor 110 and the functional element 120, so that a customized device can be provided according to specifications required by a customer by changing only the shape of the guide 130 based on the specification of various conductive cases 11. Thus, it is possible to quickly respond to a request of the customer.

Furthermore, when the guide-connected contactor 100 is minimized, even when the groove portion 11a of the conductive case 11 is roughly processed or machined using a drill having a relatively large diameter to improve the process efficiency, that is, when the groove portion 11a having a relatively large area compared to a size of the guide-connected contactor 100 is formed, a residual space of the groove portion 11a can be filled by the guide 130 such that the processing time for the groove portion 11a can be reduced and the processing steps can be simplified, thereby improving a manufacturing efficiency while providing the stable coupling.

Meanwhile, the guide-connected contactor 100 according to the embodiment of the present invention may further include an alignment member 140.

The alignment member 140 surrounds at least a portion of the functional element 120 on the upper surface of the guide 130 to align a position of the functional element 120 integrally formed with the elastic conductor 110. The alignment member 140 may align the position of the functional element 120 by confining a liquid-phase solder within a laminated region of the functional element 120 in a surface-mount technology (SMT) soldering process.

In detail, since the guide 130 is formed of the conductive material, the liquid-phase solder may flow along the upper surface of the guide 130 during the SMT soldering process. Thus, when the functional element 120 integrally formed with the elastic conductor 110 is laminated on the guide 130, the liquid-phase solder flowing during the SMT process may cause the functional element 120 to move. Therefore, the functional element 120 integrally formed with the elastic conductor 110 may not be aligned at an accurate position on the guide 130 so that the functional element 120 may be displaced to one side or a part of the functional element 120 may protrude out of the guide 130, causing a defect of the product.

In order to prevent such defect of the product, it is necessary to additionally provide a supplement mechanism such as a fixing jig for aligning the functional element 120, such that an additional cost is required for aligning the functional element 120 and a process time is increased, thereby lowering a manufacturing efficiency.

The guide-connected contactor 100 according to the embodiment of the present invention is provided with the alignment member 140 around the laminated region of the functional element 120 on the guide 130, so it is possible to prevent the functional element 120 from being displaced during the SMT process.

The alignment member 140 may include one of a photo imagable solder resist (PSR) ink, a heat resistant film, an overglass, and a nonconductive resin. In addition, the alignment member 140 may be formed on the guide 130 prior to the SMT soldering process.

When the alignment member 140 is the PSR ink, the PSR ink is applied on the guide 130 in a state in which a mask tape having a mask pattern is bonded onto the guide 130, so that the alignment member 140 may be formed on the guide 130.

Therefore, the molten solder can be confined only within the laminated region 130a of the guide 130 during the SMT soldering process while being prevented from flowing out of the laminated region 130a, thereby ensuring the alignment of the functional element 120.

As an example, as shown in FIG. 5, the alignment member 140a may be integrally formed. That is, the alignment member 140a may be configured to completely surround the laminated region 130a along the periphery of the functional element 120. Although the alignment member 140a is shown and described as completely surrounding the laminated region 130a of the functional element 120, the present invention is not limited thereto, and the alignment member 140a may come into contact with at least a part of the laminated region 130a such that the functional element 120 may be confined by the alignment member 140a.

As another example, as shown in FIG. 6, the alignment member 140b may be formed of a heat resistant film and provided on an entire upper surface of the guide 130 except for the laminated region 130a.

Figure 7:
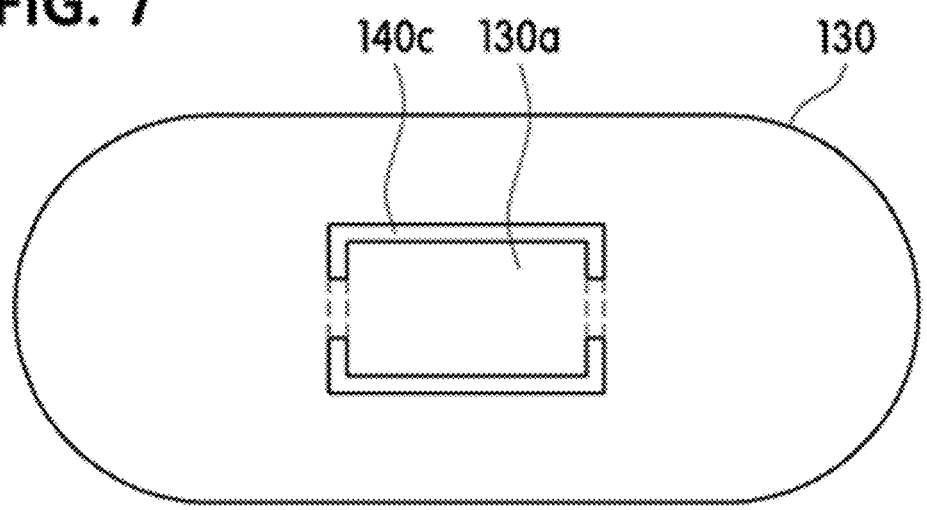
FIG. 7 is a plan view illustrating an example of alignment members which are arranged symmetrically in the guide-connected contactor according to the embodiment of the present invention.

As still another example, as shown in FIG. 7, at least two alignment members 140c may be arranged symmetrically. That is, a pattern of the mask tape may be integrally provided to form a plurality of alignment members 140c.

In this case, the alignment members 140c may come into contact with both sides of the laminated region 130a. The alignment members 140c may be provided on upper and lower sides of the laminated region 130a in the drawing in order to uniformly confine the functional element 120, but the present invention is not limited thereto and the alignment members 140c may be provided on left and right sides of the laminated region 130a.

Figure 8:
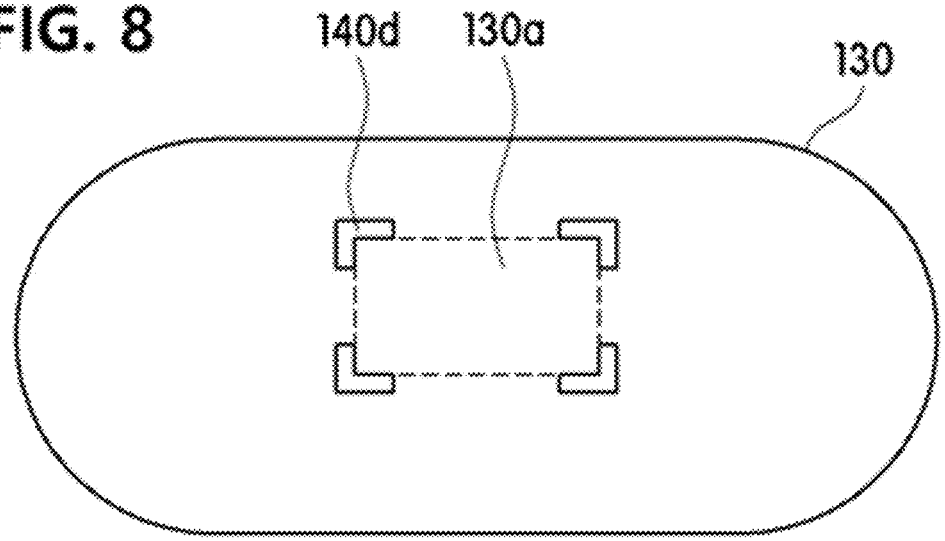
FIG. 8 is a plan view illustrating an example of alignment members disposed at diagonal points in the guide-connected contactor according to the embodiment of the present invention.

As still another example, as shown in FIG. 8, the alignment members 140d may be provided on diagonal points in an edge of the laminated region 130a. In this case, the alignment members 140d may come into surface-contact with the laminated region 130a at the diagonal points. That is, the alignment member 140d may have an "L" shape or a rotated "L" shape at four edges of the functional element 120 to come into contact with a part of edges of the functional elements 120.

The shape of the alignment members 140a to 140d as described above is for illustrative purposes only and the present invention is not limited thereto. The alignment members 140a to 140d may have various shapes so far as the alignment members 140a to 140d can restrict the functional element 120 from at least a part of a periphery of the functional element 120.

When the alignment members 140c and 140d are PSR inks, a mask tape may be provided on a portion of the guide 130 protruding outward. The mask tape may be integrally formed by dividing the patterns of the alignment members 140c and 140d.

Therefore, after applying the PSR ink, that is, after forming the alignment members 140c and 140d on the upper surface of the guide 130, the mask tape may be collectively removed from the guide 130 by a protruding portion of the mask tape. In this case, the manufacturing efficiency can be improved as compared with the alignment member 140, as shown in FIG. 5.

Meanwhile, although not shown in the drawings, the alignment member 140 may be provided as a groove formed in the upper surface of the guide 130. The groove may have a predetermined depth in a thickness direction of the guide 130.

Therefore, the solder flowing into the groove can be easily confined within the groove due to the surface tension and the groove can be easily formed through the punching process, so that the number of process steps can be reduced as compared with a case where the mask pattern is used to form the alignment member 140, thereby improving the manufacturing efficiency.

The groove may be filled with a nonconductive material. In this case, the position of the functional element 120 can be stably aligned because a molten solder can be confined by the nonconductive material.

Meanwhile, the groove portion 11a may be formed in the conductive case 11 through an end-mill process.

Figure 9:
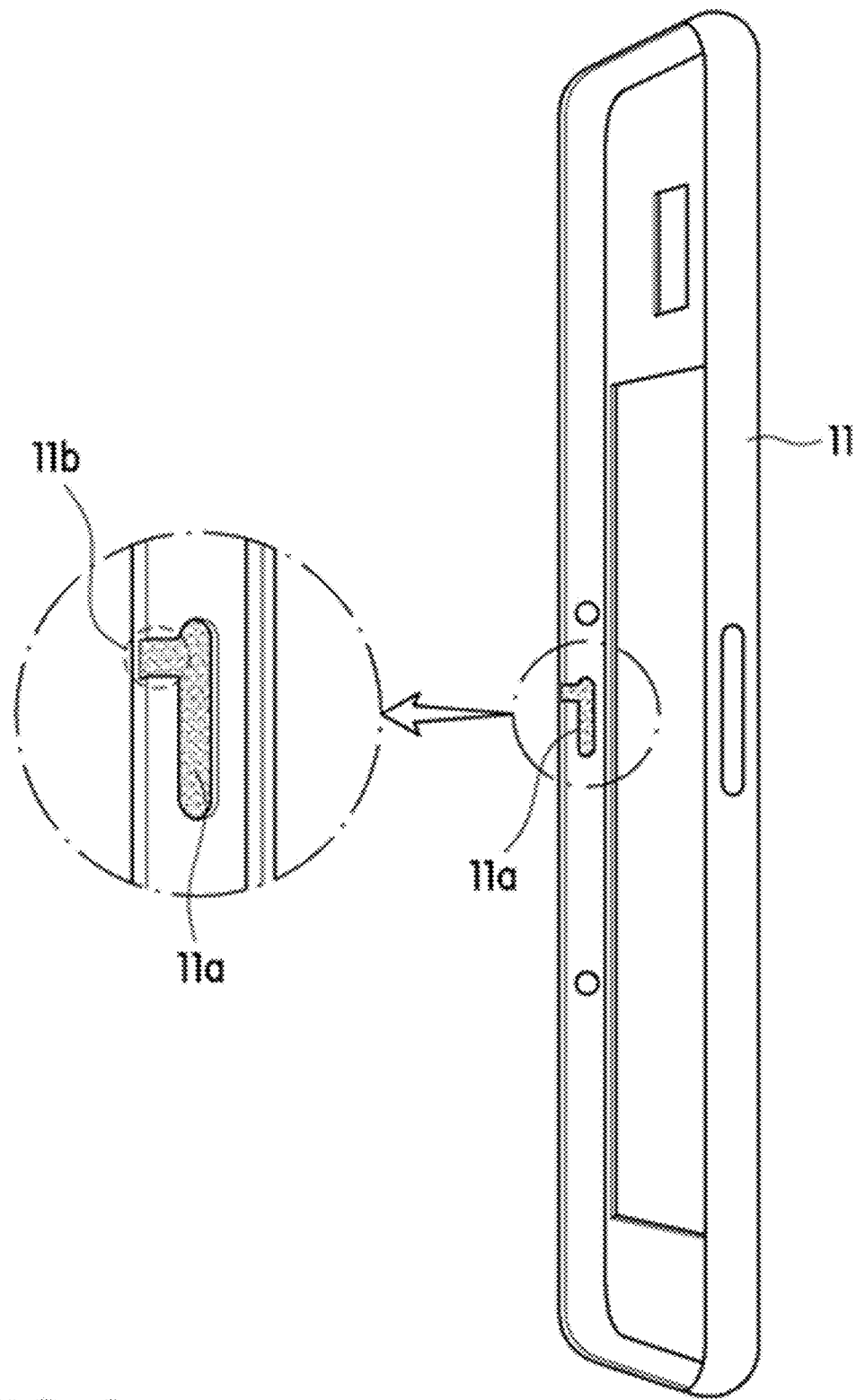
FIG. 9 is a perspective view illustrating another example of the conductive case of the portable electronic device shown in FIG. 1.

As shown in FIG. 9, when the groove portion 11a is formed by the end mill process, an opening portion 11b parallel to the groove portion 11a may be formed in an outward direction of the conductive case 11. The opening portion 11b may be formed on a path that deviates from the conductive case 11 after the groove portion 11a is formed by the end-mill process.

Figure 10:
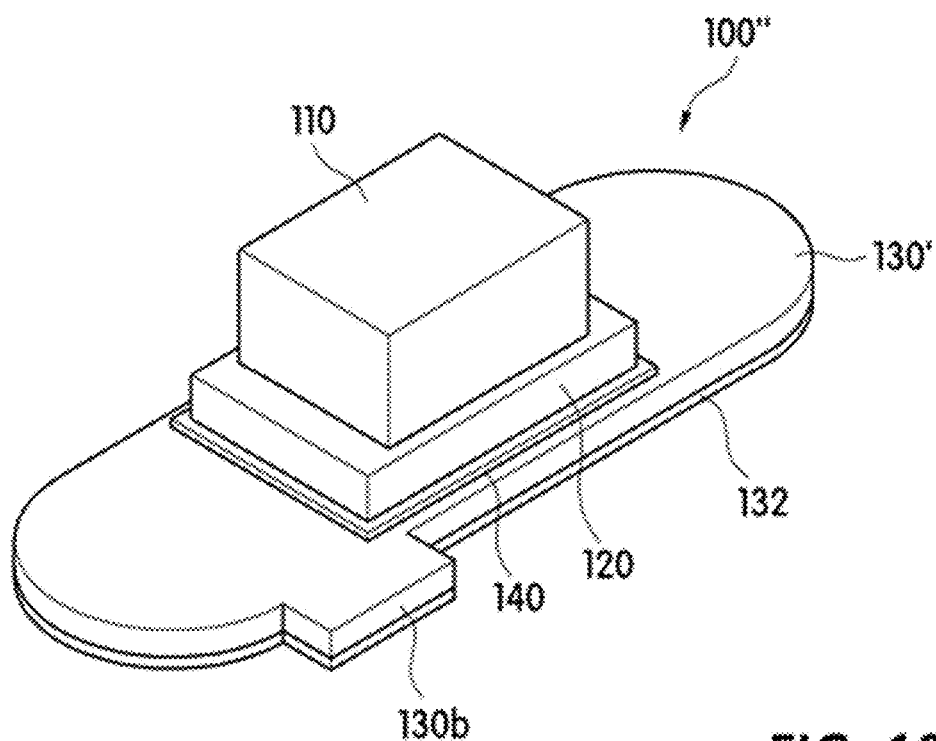
FIG. 10 is a perspective view illustrating another example of the guide-connected contactor according to the embodiment of the present invention.

As shown in FIG. 10, a wing portion 130b may protrude from at least a part of an outer periphery of the guide 130' of the guide-connected contactor 100". The wing portion 130b may serve as a pickup point for removing the guide 130' from the groove portion 11a or arranging the guide 130' in the groove portion 11a.

Although the wing portion 130b having a substantially rectangular shape is shown and described, the present invention is not limited thereto and the wing portion 130b may have various shapes. For example, the wing portion 130b may have a shape corresponding to a shape of the opening portion 11b extending outward from one side of the groove portion 11a. In this case, the wing portion 130b is not limited to a specific shape.

The wing portion 130b may be disposed at a position which is not adjacent to the functional element 120 laminated on the guide 130'. That is, when taking the position of the functional element 120 laminated on the guide 130' into consideration, in the case of the wing portion 130b which is located at a position where the width of one side of the functional element 120 and the guide 130' is small, the functional element 120 may be affected by the wing portion 130b when handling the guide 130', so the wing portion 130b may be provided at a position spaced apart from the functional element 120 by a predetermined distance.

As described above, since the wing portion 130b is provided on the guide 130' of the guide-connected contactor 100", the guide-connected contactor 100" can be easily positioned in the groove portion 11a of the conductive case or can be easily removed from the groove portion 11a of the conductive case. Therefore, the workability in the process can be improved, the contactor can be easily handled, and the failure rate can be lowered.

In addition, the wing portion 130b may be provided at one side of the guide 130' so as to be disposed in the opening portion 11b. That is, since the opening portion 11b extends outward from the groove portion 11a of the conductive case, the wing portion 130b is provided only at one side of the guide 130' corresponding to the shape of the groove portion 11a having the opening portion 11b.

As described above, since the wing portion 130b is provided only at one side of the guide 130', the directionality of the guide-connected contactor 100" can be recognized based on the position of the wing portion 130b, so that the guide-connected contactor 100" can be prevented from being erroneously inserted into the groove portion 11a of the conductive case.

Further, since the elasticity of the elastic conductor 110 having the structure in which one side is opened and the other side is connected like a C-clip may vary depending on the direction, the elastic conductor 110 can be guided to be coupled in a predetermined direction because the guide 130' can be prevented from being erroneously inserted by the wing portion 130b.

Figure 11:
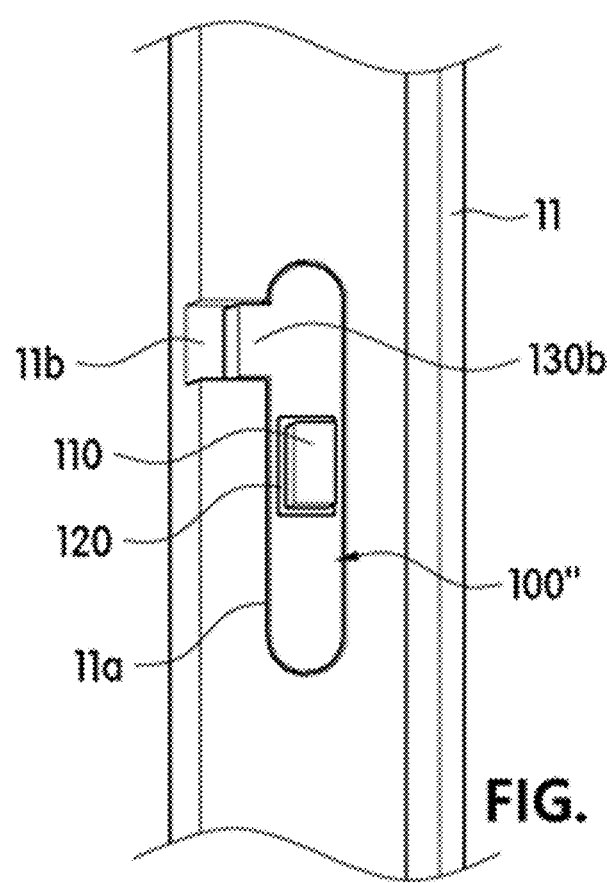
FIG. 11 is a front view illustrating a state in which the guide-connected contactor of FIG. 10 is coupled with the conductive case of FIG. 9.

Meanwhile, as shown in FIG. 11, when the guide 130' is coupled into the groove portion 11a of the conductive case 11, the wing portion 130b is disposed in the opening portion 11b of the groove portion 11a.

In this manner, since the wing portion 130b is disposed in the groove portion 11a of the conductive case 11, the wing portion 130b may confined by the opening portion 11b even when there is a clearance between the guide 130' and the groove portion 11a of the conductive case, so that the guide 130' can be prevented from being jostled during the coupling process.

Meanwhile, as shown in FIGS. 12 and 13, in the guide-connected contactor 200 according to the embodiment of the present invention, a through hole 231 is formed at the center of the guide 230, and the functional element 120 may be inserted into the through hole 231. A lower surface of the functional element 120 may be aligned to be coplanar with a lower surface of the guide 230 without being exposed to the outside of the guide 230.

However, since the functional element 120 is inserted into the through hole 231 of the guide 230, the lower surface of the functional element 120 may not be aligned to be coplanar with the lower surface of the guide 230 during the subsequent processes. In this case, the coupling stability and electrical conductivity may be degraded when the functional element 120 is coupled to the conductive case 11 through the conductive adhesive layer 132.

In order to prevent the above problem, a bonding member 233 may be provided between the functional element 120 and at least a part of the through hole 231 to fix the functional element 120 to the through hole 231. That is, the lower surfaces of the functional element 120 and the guide 230 are aligned to be coplanar in the process of inserting the functional element 120 into the through hole 231 of the guide 230, and then the functional element 120 and the guide 230 are fixed by the bonding member 233.

In this case, the bonding member 233 may fix the functional element 120 and the guide 230 permanently or temporarily. For example, when the guide 230 is coupled to the circuit board through an SMT process, the bonding member 233 may temporarily fix the functional element 120 such that the alignment of the functional element 120 cannot be disturbed, and the bonding member 233 may be removed after the guide 230 has been coupled.

For example, as shown in FIG. 13, the bonding member 233 may only be provided on two sides of the functional element 120, but the present invention is not limited thereto. The bonding member 233 may be formed on the entire outer periphery or one side of the functional element 120.

In this case, the bonding member 233 may include one of an epoxy, a solder, and a conductive resin depending on the material of the guide 230. For example, when the guide 230 is formed of a conductive material, the bonding member 233 may be formed of the solder or the conductive resin, and when the guide 230 is formed of a nonconductive material, the bonding member 233 may be formed of the epoxy.

As described above, a part of the outer periphery of the functional element 120 inserted into the through hole 231 of the guide 230 is fixed by the bonding member 233, so that the guide 230 and the functional element 120 can be stably coupled to each other before being bonded to the conductive adhesive layer 132.

Therefore, the guide-connected contactor 200 can be easily handled in the process of coupling the guide-connected contactor 200 to the conductive case 11, so that the workability can be improved. In addition, since the guide and the functional element 120 are coupled to the conductive case 11 to be coplanar, the electrical conductivity may be high, so that the failure rate of the products can be reduced.

In addition, since the functional element 120 is inserted into the through hole 231 of the guide 230, the guide 230 and the functional element 120 can be disposed on the conductive adhesive layer 132 together and coupled to the groove portion 11*a* of the conductive case 11 through the conductive adhesive layer 132.

As described above, the functional element 120 is inserted into the through hole 231 of the guide 230 and directly coupled to the conductive case 11 without passing through the guide 230, so that the current path from the functional element 120 to the conductive case 11 can be reduced by the thickness of the guide 230. Thus, the resistance corresponding to the current path can be lowered, so that the RF loss to the guide-connected contactor 200 can be reduced. Therefore, when the conductive case 11 is used as an antenna, communication performance can be improved.

Figure 16:
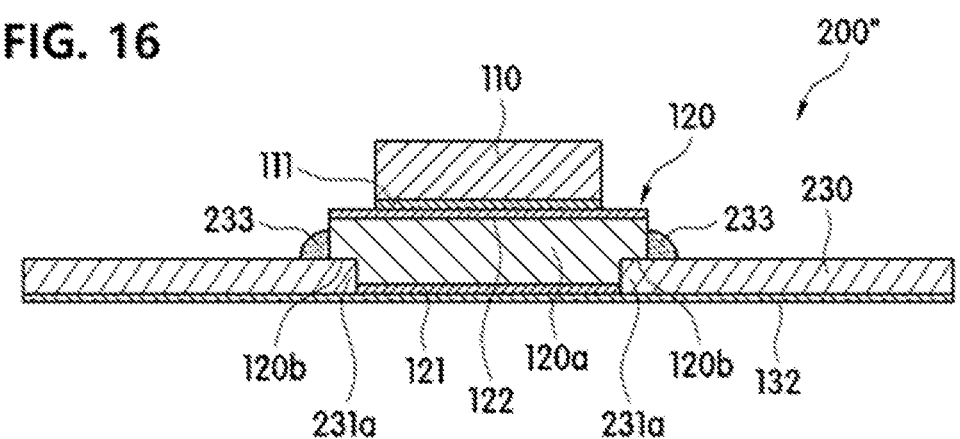
FIG. 16 is a sectional view of the guide-connected contactor having the barrier portion of FIG. 15.

Meanwhile, as shown in FIGS. 14 to 16, the guide 230 may include a barrier portion 231*a* provided on at least a part around the through hole 231 to prevent the bonding member 233 from flowing downward of the guide 230.

As shown in FIG. 14, the guide-connected contactor 200' may include the guide 230 having the barrier portion 231*a* formed of a flexible material, which can be bent, at a part of the through hole 231.

In this case, a width of the through hole 231 may be smaller than a width of the functional element 120. The barrier portion 231*a* may be bent in the insertion direction of the functional element 120 when the functional element 120 is inserted into the through hole 231.

In this manner, the barrier portion 231*a* is bent toward the side where the bonding member 233 is provided, so that the liquid-phase bonding member can be prevented from flowing downward of the guide 230 when the bonding member 233 fills a bonding portion between the functional element 120 and the through hole 231.

As shown in FIGS. 15 and 16, the guide-connected contactor 200" may include the guide 230 having the barrier portion 231*a* protruding inward into the through hole 231.

The through hole 231 may have an approximately "I" shape. That is, the barrier portion 231*a* may protrude inward from the center of both sides of the through hole 231 (see FIG. 15).

In this case, the functional element 120 may be provided on a bottom surface thereof with a concave portion 120*b* having a shape corresponding to a shape of the barrier portion 231*a*. As a result, the barrier portion 231*a* may protrude from the through hole 231 toward the functional element 120 by the width of the concave portion 120*b* (see FIG. 16).

Accordingly, the functional element 120 can be mounted on the barrier portion 231*a*. In this case, the lower surface of the functional element 120 except for the concave portion 120*b* may be aligned to be coplanar with the lower surface of the guide 230.

As described above, the barrier portion 231*a* supports the concave portion 120*b* of the functional element 120, so that the liquid-phase bonding member can be prevented from flowing downward of the guide 230 when the bonding member 233 fills a bonding portion between the functional element 120 and the through hole 231.

The barrier portion 231*a* is not limited to the above, but may be provided in various forms. For example, although not shown in the drawings, the guide 230 may have a groove or a stepped portion on at least a part around the through hole 231.

Meanwhile, the functional element 320 may be equipped with the test point function when the guide 230 is formed of a nonconductive material without a test point function, or when it is necessary to enhance the reliability of electrical contact through the guide 230.

Figure 17:
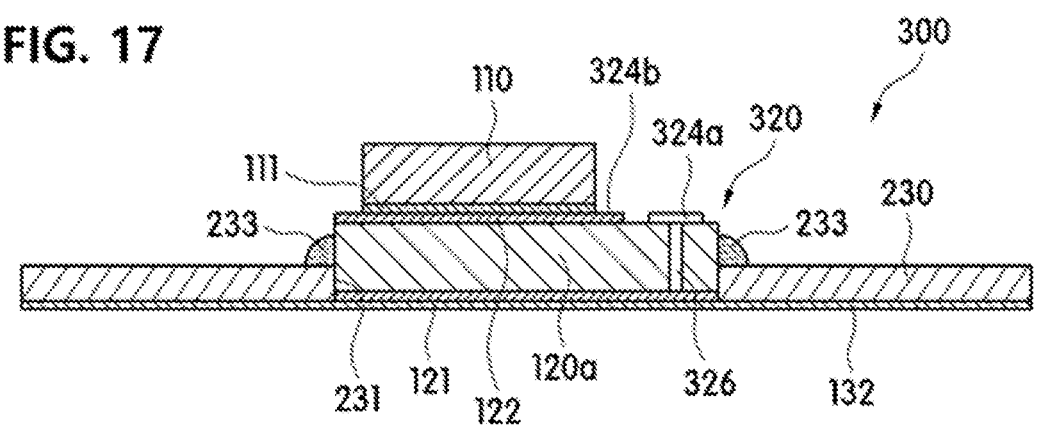
FIG. 17 is a cross-sectional view illustrating a configuration of a test point provided separately in the guide-connected contactor according to the embodiment of the present invention.

In this case, as shown in FIG. 17, the guide-connected contactor 300 may include a first test electrode 324*a* and a second test electrode 324*b*.

The first test electrode 324*a* is provided on an upper surface of a body 120*a* while being spaced apart from a second electrode 122 by a predetermined distance. The first test electrode 324*a* is used to test the connection to the conductive case 11 and connected to a first electrode 121 through a via hole 326 perpendicularly passing through the body 120*a*. In this case, the via hole 326 may be filled with a conductive material. The first test electrode 324*a* is connected to the conductive case 11 through the conductive adhesive layer 132.

The second test electrode 324*b* is provided on an upper surface of the body 120*a* while being spaced apart from the first test electrode 324*a*. The second test electrode 324*b* is used to test whether the elastic conductor 110 is normally connected to the second electrode 122 through the conductive adhesive layer 111. The second test electrode 324*b* may be connected to the second electrode 122 through an extension portion or may be at least a portion of the second electrode 122.

As described above, the electrical connection between the elastic conductor 110 and a functional element 320, and between the functional element 320 and the conductive case 11 can be easily tested using the first test electrode 324*a* and the second test electrode 324*b*, so that the possibility of failure occurring in the manufacturing process due to the defective coupling or the degradation of the characteristics of the conductive adhesive layers 111 and 132 can be easily detected, thereby lowering the failure rate of the products.

The connection medium between the first test electrode 324*a* and the first electrode 121 may not be limited to the via hole, but may be variously implemented. For example, the first test electrode 324*a* may be connected to the first electrode 121 by a connection portion provided on at least a part of a side surface of the body 120a.

Such a connection portion may be provided on a substantially central portion of a side of the body 120a in the form of a castellation or may be provided as a termination-type side electrode on the side of the body 120a. In this case, the first test electrode 323a and the connection portion may be integrally formed with the first electrode 121.

While the present invention has been particularly shown and described with reference to exemplary embodiments thereof, it is to be understood that the present invention is not limited to the disclosed exemplary embodiments. Those skilled in the art may suggest other embodiments by adding, changing, deleting, or modifying the components of the present invention and these changes also fall within the scope of the present invention.

What is claimed is:

1. A guide-connected contactor comprising:
   an elastic conductor configured to come into contact with a circuit board of an electronic device or a bracket coupled to the circuit board;
   a functional element connected to the elastic conductor and having a first electrode and a second electrode on upper and lower surfaces thereof, respectively;
   a guide having a plate shape, coupled with the functional element, and configured to be connected to a groove portion formed on a conductive case of the electronic device and
   an alignment member formed on an upper surface of the guide to surround at least a portion of the functional element so as to align a position of the functional element, wherein the functional element is coupled to the guide through a solder,
   wherein the guide is a medium for fixedly coupling the elastic conductor and the functional element, which are integrally formed, to the conductive case.

2. The guide-connected contactor of claim 1, wherein the alignment member includes one of a photo imageable solder resist (PSR) ink, a heat resistant film, an overglass, and a nonconductive resin.

3. The guide-connected contactor of claim 1, wherein the alignment member is provided on the upper surface of the guide except for a region on which the elastic conductor is laminated.

4. The guide-connected contactor of claim 1, wherein the alignment member is integrally formed.

5. The guide-connected contactor of claim 1, wherein the alignment member includes at least two alignment members symmetrically disposed.

6. The guide-connected contactor of claim 1, wherein the alignment member is configured as a groove formed in the upper surface of the guide.

7. The guide-connected contactor of claim 1, wherein the guide further includes a wing portion protruding from only a part of a side surface of the guide, and the wing portion has a shape corresponding to a shape of an opening portion extending outward from one side of an outer periphery of the groove portion.

8. The guide-connected contactor of claim 1, wherein the guide has a through hole at a center thereof, the functional element is inserted into the through hole, a bonding member is fixedly provided between the functional element and at least a part of the through hole, and the guide includes a barrier portion provided on at least a portion around the through hole to prevent the bonding member from flowing downward.

9. The guide-connected contactor of claim 8, wherein, when the functional element is inserted, the barrier portion is bent in an insertion direction of the functional element through the through hole.

10. The guide-connected contactor of claim 8, wherein the barrier portion protrudes inward into the through hole, and a recess portion is formed in a lower surface of the functional element so that the functional element is mounted on the protruded barrier portion.

11. The guide-connected contactor of claim 8, wherein the barrier portion includes a groove or a stepped portion provided on the upper surface of the guide.

12. The guide-connected contactor of claim 8, wherein the functional element is fixed to at least a part of the through hole temporarily or permanently by the bonding member provided therebetween.

13. The guide-connected contactor of claim 1, wherein the guide includes a conductor or a nonconductor, the conductor includes one of stainless steel (SUS), phosphor bronze, aluminum, and nickel silver, and the nonconductor includes one of a printed circuit board (PCB) material including FR4, a polyethylene terephthalate (PET) film, and a plastic.

14. The guide-connected contactor of claim 1, wherein the guide is coupled to the groove portion by a conductive adhesive layer.

15. The guide-connected contactor of claim 1, wherein the guide has a shape corresponding to a shape of the groove portion.

16. The guide-connected contactor of claim 1, wherein the functional element further comprises:
    a first test electrode provided on an upper surface of the functional element and electrically connected to the conductive case; and
    a second test electrode spaced apart from the first test electrode by a predetermined distance.

17. The guide-connected contactor of claim 1, wherein the functional element has at least one of an electric shock prevention function for blocking a leakage current of an external power source introduced from a ground of the circuit board of the electronic device, a communication signal transmission function for transmitting a communication signal introduced from the conductive case or the circuit board, and an electrostatic discharge (ESD) protection function for discharging static electricity introduced from the conductive case.

18. A portable electronic device comprising:
    a guide-connected contactor according to claim 1; and
    a conductive case having a groove portion to which the guide-connected contactor is coupled,
    wherein the groove portion has a shape corresponding to a shape of the guide, and
    the elastic conductor of the guide-connected contactor comes into contact with the circuit board or the conductive bracket provided at one side thereof with the circuit board.

* * * * *